United States Patent
Shi

(10) Patent No.: US 6,245,491 B1
(45) Date of Patent: Jun. 12, 2001

(54) PHOTO-ASSISTED POST EXPOSURE BAKE FOR CHEMICALLY AMPLIFIED PHOTORESIST PROCESS

(75) Inventor: Xuelong Shi, San Jose, CA (US)

(73) Assignee: National Semiconductor Corp., Santa Clara, CA (US)

( * ) Notice: Subject to any disclaimer, the term of this patent is extended or adjusted under 35 U.S.C. 154(b) by 0 days.

(21) Appl. No.: 09/245,604

(22) Filed: Feb. 5, 1999

(51) Int. Cl.$^7$ .................................................. G03F 7/38
(52) U.S. Cl. ........................ 430/322; 430/325; 430/328; 430/330
(58) Field of Search ................................. 430/322, 325, 430/327, 328, 330, 394

(56) References Cited

U.S. PATENT DOCUMENTS

| | | | |
|---|---|---|---|
| 4,581,321 | * | 4/1986 | Stahlhofen ........................... 430/325 |
| 5,631,120 | * | 5/1997 | Swirbel ................................ 430/326 |

OTHER PUBLICATIONS

Nakamura, et al.; Effect of Acid Diffusion on Resolution of a Chemically Amplified Resist in X–Ray Lithography; Japanese Journal of Applied Physics; vol. 30, No. 10; Oct. 1991 pp. 2619–2625.

Nakamura, et al.; Influence of Acid Diffusion on the Lithographic Performance of Chemically Amplified Resists; Japanese Journal of Applied Physics; vol. 31; Part 1, No. 12B; pp. 4294–4300; Dec. 1992.

Cronin, et al.; Investigation of Onium Salt Type Photoacid Generators in Positive DUV Resist Systems; SPIE vol. 2195; pp. 212–224.

G. Wallraff, et al; Thermal and Acid–Catalyzed Deprotection Kinetics in Candidates Deep Ultraviolet Resist Materials; American Vacuum Society; J. Vac. Sci. Technology B. 12(6); pp. 3857–3862; Nov./Dec. 1994.

Metz, et al.; Selectively Breaking Either Bond in the Bimolecular Reaction of HOD with Hydrogen Atoms; American Institute of Physics; J. Chem. Phys. 99(3); pp. 1744–1751; Aug. 1, 1993.

G. Marc Loudon; Organic Chemistry; Purdue University; pp. 1057–1058.

Ito, et al.; Chemical Amplification in the Design of Dry Developing Resist Materials; Polymer Engineering and Science; vol. 23, No. 18; pp. 1012–1018; Dec. 1983.

* cited by examiner

*Primary Examiner*—Kathleen Duda
(74) *Attorney, Agent, or Firm*—Stallman & Pollock LLP

(57) ABSTRACT

Acid diffusion induced critical dimension change in a chemically amplified photoresist process is suppressed by lowering the reaction activation energy barrier. Energy required to overcome the reaction activation energy barrier is provided directly to the chemical bonds that are involved in the chemical reactions, rather than providing energy solely by thermal heating, thereby significantly increasing reaction rate without increasing acid diffusion.

8 Claims, 2 Drawing Sheets

PHOTO-ASSISTED POST EXPOSURE BAKE FOR CHEMICALLY AMPLIFIED PHOTORESIST PROCESS

BACKGROUND OF THE INVENTION

1. Field of the Invention

The present invention relates to photolithographic techniques utilized in manufacturing semiconductor integrated circuits and, in particular, to a post exposure bake (PEB) technique for suppressing acid diffusion induced critical dimension changes in a chemically amplified photoresist process by reducing reaction activation energy to thereby reduce reaction time. Reaction activation energy is reduced by delivering energy required to overcome the reaction activation energy barrier directly into the chemical bonds involved in the reaction.

2. Discussion of the Related Art

Chemically amplified photoresists have been widely used in Deep UltraViolet (DUV) photolithography to manufacture integrated circuit devices with feature sizes smaller than 0.35 $\mu$m. With DUV photoresists, strong acids are generated upon DUV illumination, as shown in FIG. 1A. In the subsequent post exposure bake (PEB) step, shown in FIG. 1B, the acids act as a catalyst, inducing chain-like chemical reactions that can change the dissolution properties of the resist. This process can result in a change A in the critical dimension, as shown in FIG. 1C, due to the isotropic characteristics of the acid diffusion.

The working principle of chemically amplified photoresists can be represented by the following equations (1) and (2):

At DUV exposure step, $$Ph_3S^+X^- + h\nu \rightarrow X^{31}\ H^+ + others \qquad (1)$$

At PEB step,

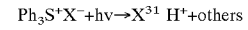  (2)

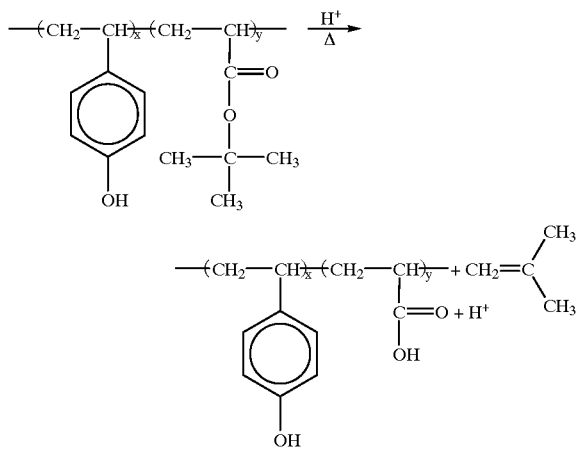

The diffusion of catalytic acids in chemically amplified resists has a strong influence on resist lithographic performance. On one hand, acid diffusion is necessary within the DUV exposed region in order to make chemical reactions occur. On the other hand, lateral diffusion of the acid, which can cause critical dimension change, is undesirable.

Ideally, the acid catalyzed chemical reactions should be completely acid diffusion controlled. That is, since the chemical reaction kinetics is much faster than the acid diffusion process, the overall chemical reaction rate may be determined by acid diffusion. In such a case, the time required to induce a certain amount of chemical reaction is minimized. Therefore, the lateral diffusion of the acid is also minimized.

In reality, the chemical reaction described by equation (2) above has a considerable "activation energy" barrier because not every collision between acid ($H^+$) and the protected group (—COOC ($CH_3)_3$)) results in chemical reaction, even at elevated PEB temperature (~130° C.). In fact, the probability of a successful collision that leads to chemical reaction is on the order of $10^{-12}$, if the activation energy is assumed to be 100 kJ/mol. This low successful collision probability results in a longer time being required to complete a certain amount of chemical reaction. Therefore the time available for acid ($H^+$) diffusion is also extended, causing a larger change in the critical dimension.

Accordingly, there is a need for a technique for suppressing the impact of acid diffusion on critical dimension change in a chemically amplified photoresist process.

SUMMARY OF THE INVENTION

One way to suppress acid diffusion induced critical dimension change in a chemically amplified photoresist process is to reduce the required reaction time by lowering the reaction activation energy barrier. In accordance with the present invention, energy required to overcome the chemical reaction activation energy barrier is delivered directly into the chemical bonds that are involved in the chemical reactions, instead of providing energy solely by thermal heating. By this means, the chemical reaction rate is increased significantly without increasing acid diffusion. A preferred method of introducing energy directly to the chemical bonds is by InfraRed (IR) radiation.

A better understanding of the features and advantages of the present invention will be obtained by reference to the following detailed description and accompanying drawings which set forth an illustrative embodiment in which the concepts of the invention are utilized.

DETAILED DESCRIPTION OF THE INVENTION

Figure 1A:
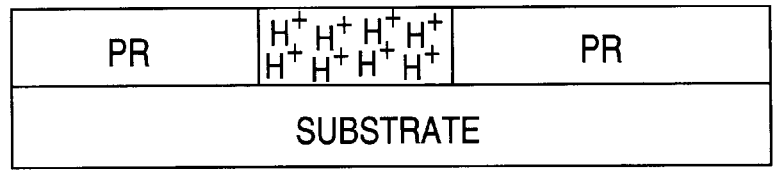
FIGS. 1A–1C are partial cross-section drawings illustrating the steps of a conventional method for post exposure bake (PEB) in a chemically amplified photoresist process.
Figure 1B:
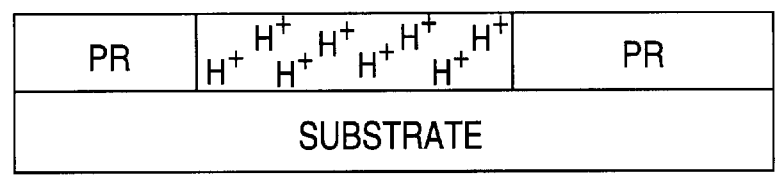
Figure 1C:
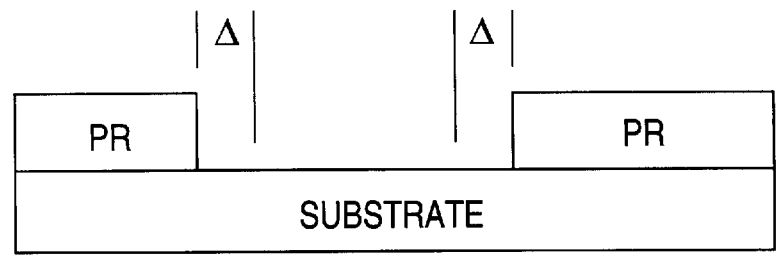
Figure 2A:
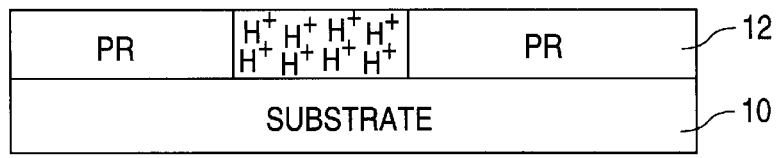
FIGS. 2A–2C are partial cross-section drawings illustrating photo-assisted post exposure bake (PEB) in a chemically amplified photoresist process in accordance with the present invention.
Figure 2B:
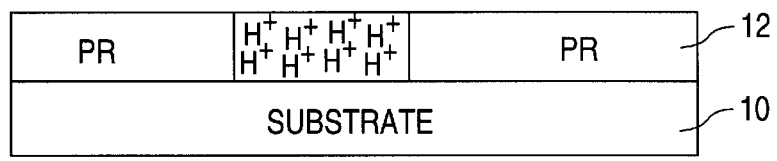
Figure 2C:
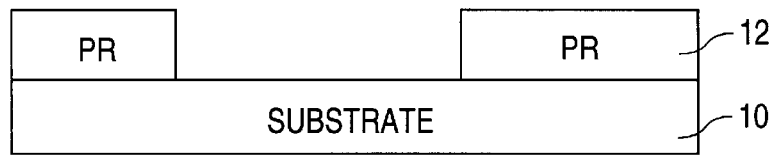

FIGS. 2A–2C illustrate the concepts of a post exposure bake technique in accordance with the present invention for suppressing acid diffusion induced changes in critical dimension in a chemically amplified photoresist process.

FIG. 2A shows a layer of photoresist 12 formed on an underlying layer of material 10. Those skilled in the art will appreciate that material 10 can be a semiconductor material (e.g., silicon) or any one of a number of conductive materials (e.g., polysilicon, metal, metal suicides) or insulating materials (e.g. silicon oxide or silicon nitride) commonly utilized in the fabrication of semiconductor integrated circuits. As further shown in FIG. 2A, selected regions of the photoresist layer 12 have been photolithographically exposed, e.g. by exposing the selected regions to deep ultraviolet (DUV) radiation which causes the generation of acids (H$^+$) in the exposed regions.

Next, as shown in FIG. 2B, the photoresist layer 12 is thermally heated, preferably in a post exposure bake (PEB) step performed at a temperature of about 80° to 140° C., and preferably at about 130° C., in a conventional PEB furnace. In accordance with the invention, simultaneously with the thermal heating step, as discussed in detail below, energy is provided directly to select selected of the chemical bonds of the photoresist material by PEB absorption.

Following the PEB step, the exposed regions of the photoresist 12 are removed by conventional methods to expose underlying regions of the material 10, as shown in FIG. 2C.

Figure 3:
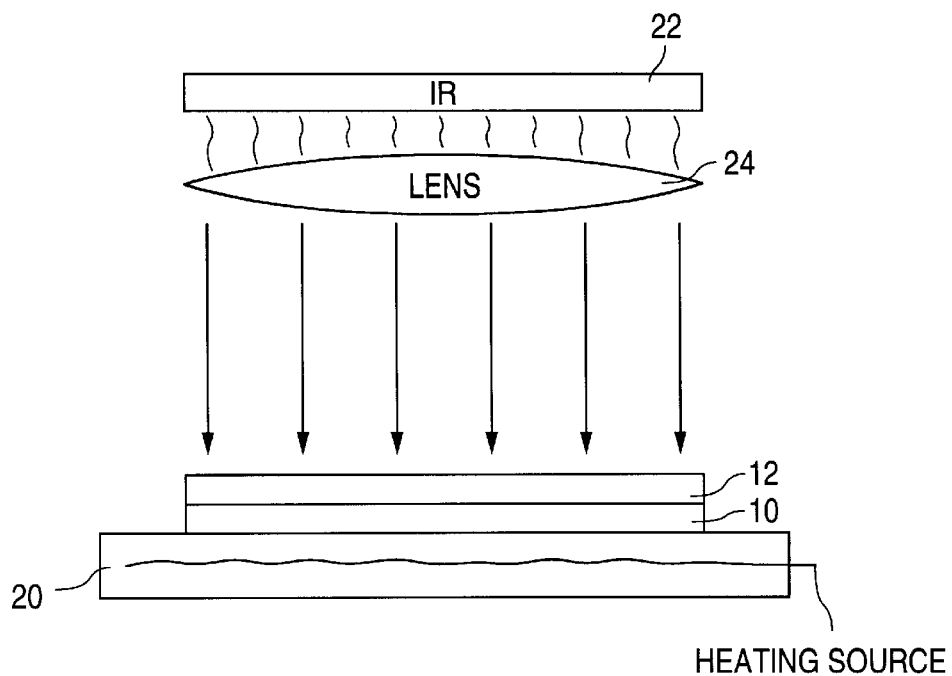
FIG. 3 is a schematic representation of a post exposure bake furnace equipped with an IR source for use in accordance with the present invention.

FIG. 3 shows a heat controlled bake plate 20 of a conventional post exposure bake furnace with a substrate 10 with ovelying photoresist 12 formed therein. In accordance with the invention, an IR source 22 provides the desired radiation to the photoresist material 12. A lens 24 assists in providing uniform IR distribution to the photorersist.

It is known that each functional group in a molecule only absorbs IR radiation at a specific frequency. It is also known that vibrational energy deposited in a particular bond enhances the probability of breaking that bond. The enhancement factor ranges approximately from 25 to 200 depending on the number of vibrational quanta deposited into the reactive bonds. The mechanism of chemical reaction described in equation (2) above is well known, and can be expressed by the following equation (3),

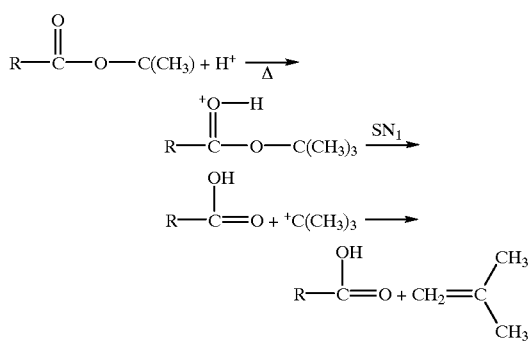

(3)

From equation (3) above, it is clear that depositing energy directly into the C=O bonds and the —O—R bonds of the resist can enhance the chemical reaction rate. The absorption of the C=O bonds is about 1700 cm$^{-1}$; the absorption of the —O—R bonds is about 1000–1300 cm$^{-1}$. By exposing the resist to IR radiation containing frequencies ranging from 1000–1800 cm$^{-1}$, or to the overtone frequency nx (1000–1800 cm$^{-1}$), during the PEB step, some fraction of the C=O bonds and the —O—R bonds become excited into the vibrational excited state, enhancing the chemical reaction rate. The enhanced reaction rate reduces the required time for a certain amount of reaction to occur. Therefore, the time for acid diffusion is also reduced and the acid diffusion induced critical dimension change is suppressed.

Various other modifications and alterations in the above-disclosed technique will be apparent to those skilled in the art without departing from the scope and spirit of the invention. Although the invention has been described in connection with preferred embodiments, it should be understood that the invention as claimed should not be so limited. It is intended that the following claims define the scope of the invention and that methods within the scope of these claims and their equivalents be covered thereby.

What is claimed is:

1. A photoresist process comprising:

forming a layer of photoresist on an underlying layer of material;

photolithographically exposing selected regions of the photoresist layer;

thermally heating the photoresist layer while simultaneously providing energy directly to selected chemical bonds of the photoresist; and removing the exposed selected regions of the photoresist layer to expose underlying material.

2. A photoresist process as in claim 1, and wherein the step of thermally heating comprises a post exposure bake (PEB) step.

3. A photoresist process as in claim 1, and wherein the step of providing energy comprises providing infrared radiation.

4. A photoresist process comprising:

forming a layer of photoresist on an underlying layer of material;

exposing selected regions of the photoresist layer to deep ultraviolet radiation;

thermally heating the exposed photoresist layer while simultaneously providing selected frequencies of infrared radiation to the exposed photoresist layer;

removing the exposed selected regions of the photoresist layer to expose underlying material.

5. A photoresist process as in claim 4, and wherein the step of thermally heating comprises a post exposure bake (PEB) step performed at about 130° C.

6. A photoresist process as in claim 4, and wherein the step of providing IR radiation comprises exposing the photoresist to IR radiation containing frequencies ranging from 1000–1800 cm$^{-1}$.

7. A photoresist process as in claim 4, and wherein the step of providing IR radiation comprises exposing the photoresist to IR radiation containing overtone frequencies nx, where n is an integer and x ranges from 1000–1800 cm$^{-1}$.

8. A photoresist process as in claim 4, and wherein the step of providing IR radiation comprises exposing the photoresist to IR radiation containing frequencies of about 1700 cm$^{-1}$ and about 1000–1300 cm$^{-1}$.

\* \* \* \* \*